United States Patent
Duvnjak

(10) Patent No.: US 12,431,889 B2
(45) Date of Patent: Sep. 30, 2025

(54) FAST TURN-ON PROTECTION OF A CASCODE SWITCH

(71) Applicant: Power Integrations, Inc., San Jose, CA (US)

(72) Inventor: Rajko Duvnjak, Kanata (CA)

(73) Assignee: POWER INTEGRATIONS, INC., San Jose, CA (US)

(*) Notice: Subject to any disclaimer, the term of this patent is extended or adjusted under 35 U.S.C. 154(b) by 0 days.

(21) Appl. No.: 18/664,092

(22) Filed: May 14, 2024

(65) Prior Publication Data

US 2024/0380395 A1 Nov. 14, 2024

Related U.S. Application Data

(63) Continuation of application No. 18/254,947, filed as application No. PCT/US2021/061418 on Dec. 1, 2021.

(60) Provisional application No. 63/129,086, filed on Dec. 22, 2020.

(51) Int. Cl.
   *H03K 17/082* (2006.01)

(52) U.S. Cl.
   CPC .......... *H03K 17/0822* (2013.01); *H03K 2217/94047* (2013.01)

(58) Field of Classification Search
   CPC ...... H03K 17/0822; H02H 3/08; H02H 3/093; H02H 7/12; H02H 9/002; H02H 17/08–0828
   See application file for complete search history.

(56) References Cited

U.S. PATENT DOCUMENTS

| | | | |
|---|---|---|---|
| 10,135,357 B1 | 11/2018 | Balakrishnan et al. | |
| 2015/0137619 A1 | 5/2015 | Seeman et al. | |
| 2019/0149062 A1* | 5/2019 | Duvnjak | H03K 17/102 323/285 |

FOREIGN PATENT DOCUMENTS

| | | |
|---|---|---|
| EP | 3416288 A1 | 12/2018 |
| EP | 2466752 B1 | 3/2020 |
| JP | 2013135574 A | 7/2013 |
| JP | 2016201693 A | 12/2016 |
| JP | 2016540477 A | 12/2016 |
| JP | 2019004686 A | 1/2019 |
| JP | 2020107966 A | 7/2020 |
| TW | 1399015 B | 6/2013 |
| TW | 1617126 B | 3/2018 |

OTHER PUBLICATIONS

European Application Serial No. 21835050.2; "Communication Pursuant to Article 94(3) EPC"; mailed Nov. 6, 2023; 5 pages.

(Continued)

*Primary Examiner* — Thienvu V Tran
*Assistant Examiner* — Christopher J Clark
(74) *Attorney, Agent, or Firm* — Brian H. Floyd

(57) ABSTRACT

Fast turn-on protection of a cascode switch is presented herein. A cascode circuit includes a depletion mode field effect transistor and an enhancement mode field effect transistor electrically coupled in cascode. During turn-on, a protection circuit detects an overcurrent fault by observing a plateau of a cascode node voltage. An overcurrent fault may be detected in response to the plateau existing for greater than a threshold time duration.

10 Claims, 4 Drawing Sheets

(56) References Cited

OTHER PUBLICATIONS

European Application Serial No. 21835050.2; "Communication under Rule 71(3) EPC"; mailed Feb. 15, 2024, 35 pages.
PCT Application No. PCT/US2021/061418; "International Preliminary Report on Patentability"; mailed Mar. 28, 2023; 19 pages.
PCT Application No. PCT/US2021/061418; "International Search Report and Written Opinion of the International Searching Authority"; mailed Mar. 3, 2022; 10 pages.
Taiwanese Application Serial No. 110147860, Notice of Decision to Grant with English Translation mailed Jun. 17, 2025, 6 pages.
Japanese Application Serial No. 2023-537649; "Decision to Grant Patent with Machine Translation"; mailed Jul. 8, 2025; 7 pages with English translation.

* cited by examiner

FAST TURN-ON PROTECTION OF A CASCODE SWITCH

CROSS-REFERENCE TO RELATED APPLICATIONS

This application is a continuation of U.S. patent application Ser. No. 18/254,947, filed on May 30, 2023, now U.S. Pat. No. 12,015,394, which is a National Stage Entry of International Patent Application No. PCT/US2021/061418, filed on Dec. 1, 2021, which claims priority from U.S. Provisional Application No. 63/129,086, filed on Dec. 22, 2020, hereby incorporated by reference in their entirety.

BACKGROUND INFORMATION

Field of the Disclosure

The present disclosure relates generally to overcurrent protection, and more specifically to fast turn-on protection of a cascode switch.

Background

Electronic devices use power to operate. Switched mode power converters are commonly used due to their high efficiency, small size and low weight to power many of today's electronics. Conventional wall sockets provide a high voltage alternating current. In a switching power converter, a high voltage alternating current (ac) input is converted to provide a well-regulated direct current (dc) output through an energy transfer element. The switched mode power converter controller usually provides output regulation by sensing one or more inputs representative of one or more output quantities and controlling the output in a closed loop. In operation, a switch is utilized to provide the desired output by varying the duty cycle (typically the ratio of the on time of the switch to the total switching period), varying the switching frequency, or varying the number of pulses per unit time of the switch in a switched mode power converter.

Gallium nitride (GaN) and other wide band-gap nitride III based direct transitional semiconductor materials exhibit high break-down electric fields and avail high current densities. In this regard GaN based semiconductor devices are actively researched as an alternative to silicon based semiconductor devices in power and high frequency applications. For instance, a GaN HEMT may provide lower specific on resistance with higher breakdown voltage relative to a silicon power field effect transistor of commensurate area.

Power field effect transistors (FETs) can be enhancement mode or depletion mode. An enhancement mode device may refer to a transistor (e.g., a field effect transistor) which blocks current (i.e., which is off) when there is no applied gate bias (i.e., when the gate to source bias is zero). In contrast, a depletion mode device may refer to a transistor which allows current (i.e., which is on) when the gate to source bias is zero.

BRIEF DESCRIPTION OF THE DRAWINGS

Non-limiting and non-exhaustive embodiments for fast turn-on protection of a cascode switch are described with reference to the following figures, wherein like reference numerals refer to like parts throughout the various views unless otherwise specified.

Figure 1A:
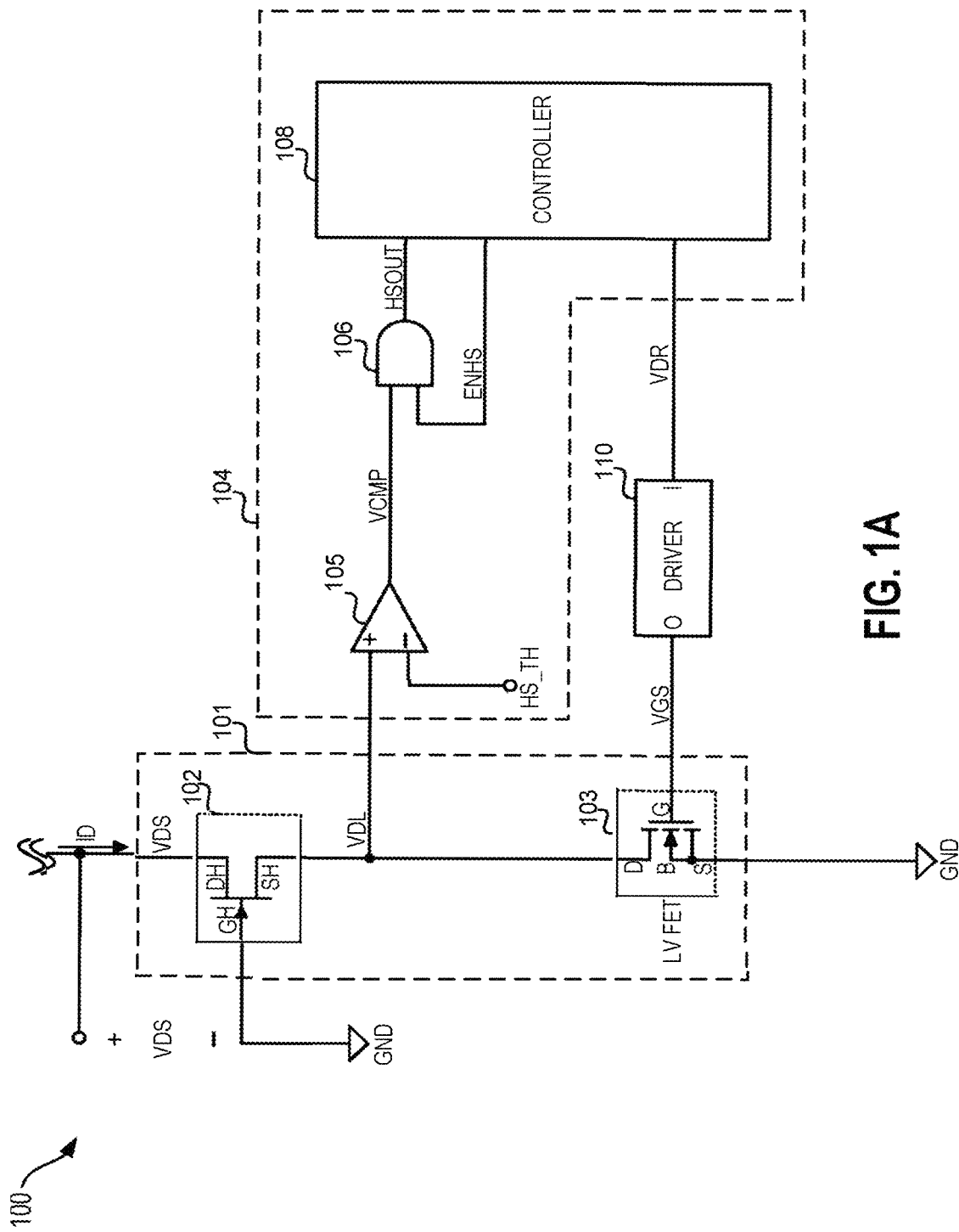
FIG. 1A illustrates a circuit including a cascode switch, a protection circuit, and a driver according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. Also, common but well-understood elements that are useful or necessary in a commercially feasible embodiment are often not depicted in order to facilitate a less obstructed view of these various embodiments of the teachings herein.

DETAILED DESCRIPTION

In the following description, numerous specific details are set forth in order to provide a thorough understanding of fast turn-on protection of a cascode switch. It will be apparent, however, to one having ordinary skill in the art that the specific detail need not be employed to practice the teachings herein. In other instances, well-known materials or methods have not been described in detail in order to avoid obscuring the present disclosure.

Reference throughout this specification to "one embodiment", "an embodiment", "one example" or "an example" means that a particular feature, structure or characteristic described in connection with the embodiment or example is included in at least one embodiment of the teachings herein. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings, including waveforms, are not necessarily drawn to scale.

In the context of the present application, when a transistor is in an "off-state" or "off" the transistor blocks current and/or does not substantially conduct current. Conversely, when a transistor is in an "on-state" or "on" the transistor is able to substantially conduct current. By way of example, a transistor may comprise an N-channel metal-oxide-semiconductor (NMOS) field-effect transistor (FET) with the high-voltage being supported between the first terminal, a drain, and the second terminal, a source.

As discussed above an enhancement mode device may refer to a transistor which blocks current when a control voltage (e.g., a gate-to-source voltage) is low (e.g., zero volts). In many circuit and switching applications, it may be desirable to use an enhancement mode transistor (i.e., an enhancement mode device) to realize circuit functions. For instance, in power applications it is often desirable to use a power transistor as a switch (i.e., a power switch). Ideally, a power transistor may operate as a switch when it blocks current in one state (e.g., a state of zero control voltage) and provides current with low on resistance and low power loss in a second state (e.g., a state of non-zero control voltage).

Also, in the context of the present application, a cascode may be constructed from two transistors (e.g., field effect transistors and/or bipolar junction transistors). When a cascode is configured to operate as an amplifier, it may be referred to as a cascode amplifier. Additionally, when a cascode is configured to operate as a switch, it may also be referred to as a cascode switch. Cascodes may also be classified based on transistor type; for instance, a cascode including a Gallium Nitride depletion mode transistor may be referred to as a GaN cascode, GaN cascode switch, and/or GaN cascode amplifier. Alternatively, and additionally, one may refer to a cascode as a cascode configuration, cascode device, and/or a cascode circuit. Additionally, during operation, cascodes may exhibit gain (e.g., voltage gain); and one may refer to the gain of a cascode as cascode gain, cascode circuit gain, cascode device gain, and the like.

Modern high-power converters and power converters may use cascode devices, including Gallium Nitride (GaN) cascode devices (e.g., GaN cascode switches). Examples of modern high-power converters and/or modern power converters which may subject cascode devices (e.g., cascode switches) to faults and high currents may include, but are not limited to, power factor correction (PFC) converters, flyback converters, buck converters, and/or boost converters. For instance, as used in a PFC converter, a cascode switch (e.g., a GaN cascode switch) may be subjected to very high currents (e.g., fifty amperes) in a short period of time (e.g., one-hundred nanoseconds) if the PFC inductor is shorted. Alternatively, and additionally, as used in a boost converter, a cascode switch (e.g., a GaN cascode switch) may be subjected to very high currents when a boost diode is shorted.

Often power converters, high-power converters, and their switches (e.g., cascode switches) require protection in the event of a fault and/or overcurrent condition. Traditionally, overcurrent (i.e., an overcurrent condition) may be detected with a protection circuit and/or with a sense field effect transistor (FET). Typically, leading edge blanking approaches may be adopted to avoid sensing information (e.g., current information) from the sense FET during the initial transient. During an initial transient the sensing information signal may contain noise with appreciable amplitude in respect to the sensing information signal; and additional filtering may be needed to extract the sensing information signal. A power converter using leading edge blanking may wait for the protection circuit and/or sense FET to reach a stable operating condition; and this may result in longer time to detect the overcurrent operating condition.

Unfortunately, in modern power converters an overcurrent condition (i.e., an excessive current event) may happen rapidly following turn-on. For instance, overcurrent may occur rapidly, on a time scale less than a leading-edge blanking time, in a low on-resistance (i.e., low RDS) device (e.g., low RDS switch). Accordingly, overcurrent in modern power converters using low on resistance cascode switches (e.g., GaN cascode switches and/or Silicon Carbide (SiC) cascode switches), may occur too rapidly to be detected by a traditional protection circuit using leading edge blanking.

Thus, there is a need for a protection circuit which may rapidly detect an overcurrent condition following turn-on.

Apparatus and methods of fast turn-on protection of a cascode switch are presented herein. A cascode circuit includes a depletion mode field effect transistor and an enhancement mode field effect transistor electrically coupled in cascode. During turn-on, a protection circuit detects an overcurrent fault by observing a plateau of a cascode node voltage. An overcurrent fault may be detected in response to the plateau existing for greater than a threshold time duration.

FIG. 1A illustrates a circuit 100 including a cascode switch 101, a protection circuit 104, and a driver 110 according to an embodiment. Protection circuit 104 includes a comparator 105, a logic AND gate 106, and a controller 108. The cascode switch 101 may include a depletion mode field effect transistor 102 and an enhancement mode field effect transistor 103. The depletion mode field effect transistor 102 may be a gallium nitride (GaN) depletion mode field effect transistor (FET) 102 or a silicon carbide (SiC) depletion mode field effect transistor 102. The enhancement mode field effect transistor 103 may be a low voltage field effect transistor (FET) 103.

The GaN depletion mode FET 102 includes a GaN source SH, GaN gate GH, and GaN drain DH; and the low voltage FET 103 includes a FET source S, FET gate G, FET drain D, and FET body B. As illustrated the GaN depletion mode FET 102 is electrically coupled in cascode with the low voltage FET 103, whereby the GaN source SH is electrically coupled to the FET drain D. Additionally, the FET body B is electrically coupled to the FET source S; and the GaN gate GH and the FET source S are electrically coupled to ground GND.

Having this configuration (i.e., cascode configuration) the cascode switch 101 may advantageously operate in enhancement mode (i.e., operate as a normally off device) in response to gate voltage VGS applied at the FET gate G. For instance, the cascode switch 101 may block cascode switch current ID when the gate voltage VGS is less than a threshold voltage of the low voltage FET 103 (e.g., two volts); and the cascode switch 101 may conduct cascode switch current ID between the GaN drain DH and the FET source S when the gate voltage VGS is greater than the threshold voltage of the low voltage FET 103. Accordingly, the cascode switch 101 may "turn-on" when the gate voltage VGS transitions (i.e., switches) cascode switch 101 from its off-state to its on-state.

As illustrated, the cascode switch 101 may support a drain voltage VDS between the GaN drain DH and the FET source S. As the FET source S is electrically coupled to ground, the drain voltage VDS may also be referred to as the drain-to-source voltage VDS of the cascode switch 101.

As discussed above, the protection circuit 104 includes a comparator 105, a logic AND gate 106, and a controller 108. The noninverting input of comparator 105 may be electrically coupled to the FET drain D to compare a cascode (e.g., cascode circuit) node voltage VDL with a threshold voltage HS_TH (e.g., five volts) at the inverting input of comparator 105. The comparator output voltage VCMP may be asserted high (i.e., logic state high) while the cascode node voltage VDL exceeds the threshold voltage HS_TH.

Also as illustrated, a first input of the logic AND gate 106 may be electrically coupled to the output of the comparator 105 to receive comparator output voltage VCMP. The second input of the logic AND gate 106 may be electrically coupled to an output of the controller 108; and the output of the logic AND gate 106 may be electrically coupled to an input of the controller 108. As shown, the logic AND gate 106 provides signal HSOUT as the logical AND function of the comparator output voltage VCMP and an enable signal ENHS.

According to the teachings herein, during turn-on (i.e., following application of a gate voltage VGS) the cascode node voltage VDL may exhibit a plateau; and the protection circuit 104 may determine if an overcurrent condition exists by monitoring the duration of the plateau. For instance, as discussed below with respect to the waveforms of FIG. 2, the controller 108 may assert enable signal ENHS high after a calibrated and/or specified time duration (e.g., three hundred nanoseconds) following application of a gate voltage VGS.

Accordingly, signal HSOUT may indicate the duration while the comparator output voltage VCMP remains high (i.e., the duration of the plateau in cascode node voltage VDL). In turn, the controller 108 may, in response to the signal HSOUT, determine that the cascode switch current ID is excessive and take corrective action (e.g., turn off the cascode switch). In one embodiment the corrective action (e.g., turning off the cascode switch 101) may be performed after each turn-on event during switching cycles. Alternatively, and additionally, the corrective action may force the cascode switch 101 to remain off until the controller 108 is recycled.

Additionally, the driver 110 may be electrically coupled between the controller 108 and the cascode switch 101 to function as a gate driver. As illustrated, the controller 108 provides driver input voltage VDR to the input (I) of the driver 110; in turn, the driver 110 provides the gate voltage VGS at the output (O). For instance, driver 110 may buffer (e.g., amplify) driver input voltage VDR from the controller 108 so that the gate voltage VGS is delivered with increased, sufficient power to drive the FET gate G.

Although, the driver 110 is shown as being external to the controller 108, in other embodiments the driver 110 may be an internal to the controller 108. For instance, the controller 108 may avail a low impedance driver output port to directly drive the FET gate G with a gate voltage VGS.

Similarly, as one of ordinary skill in the art may appreciate, the protection circuit 104 may be realized with greater or fewer circuit elements. For instead as an alternative to using the comparator 105 and/or the logic AND gate 106, the cascode node voltage VDL may be provided directly to the controller 108. The controller 108, in turn, may use analog and/or digital processing to determine the duration of a plateau.

Although controller 108 is described above in the context of the protection circuit 104, controller 108 may also provide driver input voltage VDR based on additional system variables. For instance, as presented in FIG. 1B, controller 108 may also receive an output voltage VOUT and provide driver input voltage VDR to regulate the output voltage VOUT.

Figure 1B:
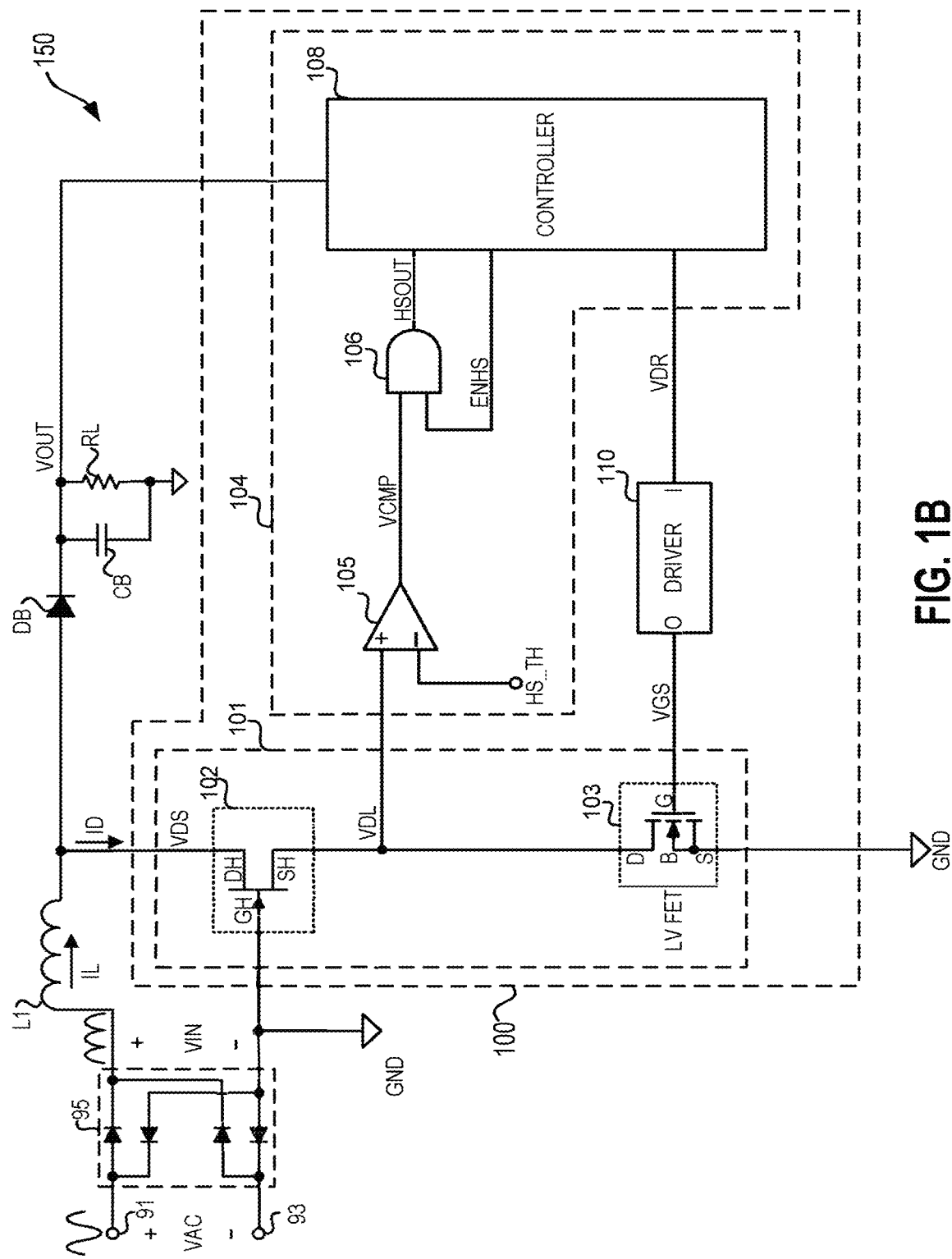
FIG. 1B illustrates a power converter including the cascode switch, the protection circuit, and the driver according to an embodiment.

FIG. 1B illustrates a power converter 150 including the cascode switch 101, the protection circuit 104, and the driver 110 according to an embodiment. The power converter 150 includes circuit 100 of FIG. 1A, a bridge rectifier 95, an inductor L1, a diode DB, an output capacitor CB, and a load RL. Alternating current (ac) input power with an ac voltage VAC may be delivered between input terminals 91 and 93 to the bridge rectifier 95. The bridge rectifier 95, in turn, may rectify the ac input power to provide the rectified input power (i.e., input power supply signals including inductor current IL and input voltage VIN) relative to ground GND.

As illustrated the controller 108 may provide driver input voltage VDR so that the gate voltage VGS switches the cascode switch 101 on and off according to a switching cycle. According to switching power supply theory, the controller 108 may be part of a control loop configured to sample and to regulate the output voltage VOUT. The output voltage VOUT may be regulated when the controller 108 causes the cascode switch 101 to switch on and off according to a steady state switching frequency. For instance, the power converter 150 may be configured as a boost converter and/or as a boost converter with power factor correction (PFC).

According to the teachings herein, the protection circuit 104 may protect cascode switch 101 each time the cascode switch 101 is switched on (i.e., turned on by the gate voltage VGS). For instance, if the inductor L1 becomes shorted, this may give rise to an excessive, overcurrent condition in cascode switch 101. As described herein, the protection circuit 104 may rapidly (i.e., on the order of one-hundred nanoseconds or less) detect overcurrent by observing the duration of a plateau in the cascode node voltage VDL.

Alternatively, and additionally, the protection circuit 104 may protect cascode switch 101 by turning the cascode switch 101 off for a period (e.g., one millisecond) longer than the switching cycle (e.g., ten microseconds). For instance, in response to determining the existence of an overcurrent condition (e.g., a short), the protection circuit 104 may turn off the cascode switch 101 and keep it off until the controller 108 becomes refreshed. Additionally, the protection circuit 104 may determine a fault (e.g., a short) after measuring the fault for several consecutive cycles (e.g., five consecutive switching cycles).

According to the teachings herein, the threshold voltage HS_TH and a threshold time duration THS may be empirically determined and/or calibrated to assure that the protection circuit distinguishes normal modes of operation over a fault mode (i.e., an overcurrent and/or short-circuit condition).

Turn-On Transient Behavior of a Cascode Switch

Figure 2:
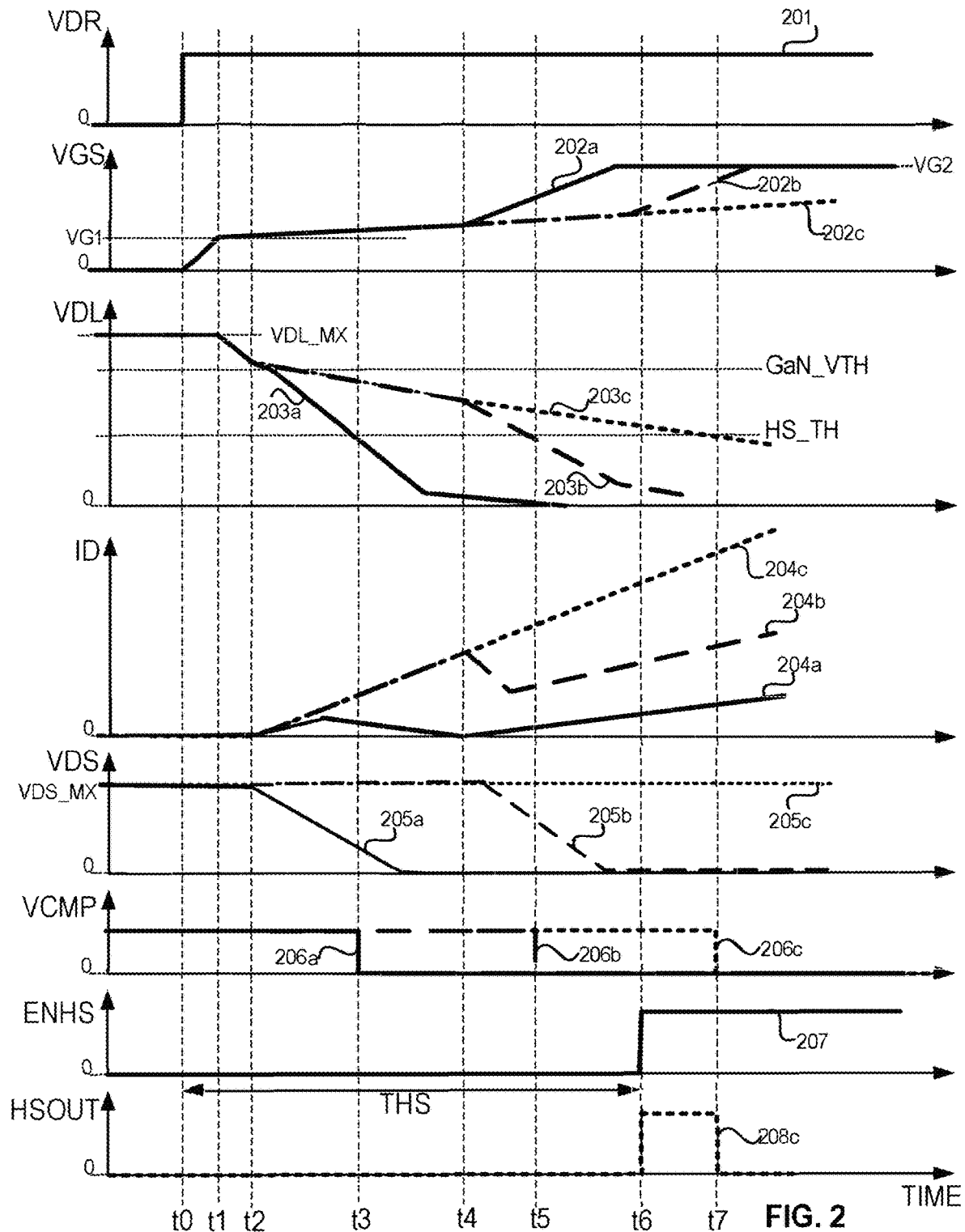
FIG. 2 compares turn-on waveforms for different modes of operation according to the teachings herein.

For instance, FIG. 2 compares turn-on waveforms 201, 202a-c, 203a-c, 204a-c, 205a-c, 206a-c, 207, 208c, for different modes of operation according to the teachings herein. The different modes of operation include discontinuous condition mode (DCM), continuous conduction mode (CCM), and a fault mode (e.g., a short-circuit or overcurrent condition). As illustrated, the waveforms 201, 202a-c, 203a-c, 204a-c, 205a-c, 206a-c, 207, 208c are plotted as a function of time for a turn on event occurring at time t0. Accordingly, times t1-t7 may delineate temporal events during the turn on transient of the cascode switch 101.

As shown in FIG. 2, waveform 201 depicts driver input voltage VDR. Waveforms 202a-c illustrate gate voltage VGS (i.e., gate-to-source voltage) of the low voltage FET 103 during DCM, CCM, and fault mode, respectively. Waveforms 203a-c illustrate cascode node voltage VDL during DCM, CCM, and fault mode, respectively. Waveforms 204a-c illustrate cascode switch current ID during DCM, CCM, and fault mode, respectively. Waveforms 205a-c illustrate the drain-to-source voltage VDS during DCM, CCM, and fault mode, respectively. Waveforms 206a-c illustrate the comparator output voltage VCMP during DCM, CCM, and fault mode, respectively. Waveform 207 illustrates enable signal ENHS from the controller 108; and waveform 208a-c illustrates signal HSOUT during fault mode.

Behavior Prior to Turn-On at Time t0

Prior to time t0 the driver input voltage VDR may be exerted low (e.g., exerted to zero volts) as shown by waveform 201. Concurrently the driver 110 forces the FET gate G to be low so that the cascode switch 101 blocks current in its off state. Thus, for time less than time t0, the driver 110 may hold gate voltage VGS to be substantially equal to zero as indicated by waveforms 202a-c.

Additionally, the cascode node voltage VDL may have a steady state value dependent, at least in part, on a threshold voltage magnitude GaN_VTH (e.g., ten volts) of the GaN depletion mode FET 102. Thus, for time less than time to, the cascode node voltage VDL may maintain a maximum node voltage VDL_MX (e.g., fifteen volts) as indicated by waveforms 203*a-c*. Also, according to the teachings herein, the threshold voltage HS_TH may be selected (e.g., calibrated) to be indicative of an overcurrent condition; therefore, the threshold voltage HS_TH may have a value (e.g., five volts) less than the threshold voltage magnitude GaN_VTH.

While the cascode switch 101 operates in the off state prior to time to, the cascode switch current ID may be substantially equal to its blocking state (e.g., leakage) current. Thus, for time less than t0, the cascode switch current ID may be substantially equal to zero (e.g., less than one hundred micro-amperes) as illustrated by waveforms 204*a-c*.

Concurrently, prior to time to, the cascode switch 101 may sustain a drain voltage VDS determined, at least in part, upon the breakdown voltage (e.g., eight-hundred volts) of the GaN depletion mode FET 102. Thus, prior to time t0, the drain voltage VDS may be at its maximum drain voltage VDS_MX (e.g., six-hundred volts) as illustrated by waveforms 205*a-c*.

Also, prior to time to while the cascode switch 101 is off, the protection circuit 104 may be in standby and/or disabled by virtue of the enable signal ENHS. For instance, with reference to waveforms 203*a-c*, the cascode node voltage VDL may be greater than the threshold voltage HS_TH. Accordingly, the comparator output voltage VCMP may indicate the cascode node voltage VDL is greater than the threshold voltage HS_TH. Thus, prior to time to the comparator output voltage VCMP is logic high (e.g., five volts) as illustrated by waveforms 206*a-c*.

However, prior to time t0, the controller 108 may exert the enable signal ENHS low so that the output of the logic AND gate 106 remains low. Accordingly, the enable signal ENHS may be exerted low (e.g., zero volts), so that signal HSOUT remains low (e.g., zero volts), as illustrated by waveform 207 and waveform 208*c*.

Behavior at Time t0

At time t0 (e.g., zero nanoseconds) the controller 108 may exert driver input voltage VDR to initiate turn-on (e.g., to begin the process of turning-on the cascode switch 101). For instance, as illustrated by waveform 201, the driver input voltage VDR may be exerted high (e.g., five volts) at time to.

According to the teachings herein, the threshold time duration THS may be a time duration which begins concurrent with and/or substantially concurrent with the initiate turn-on event at time t0. For instance, an analog and/or digital timer may begin timing the threshold time duration THS starting at time t0; and the threshold time duration THS may have a preselected value (e.g., two-hundred fifty nanoseconds) based on empirical data and/or calibration.

In response to the transition of the driver input voltage VDR at time t0, the driver 110 may begin to drive the FET gate G. For instance, as illustrated by waveforms 202*a-c*, the gate voltage VGS may begin to ramp (i.e., increase in voltage).

Additionally, at time to the low voltage FET 103 may instantaneously remain in its off state. Accordingly, at time to the cascode switch 101 may be off. For instance, as illustrated by waveforms 203*a-c*, the cascode node voltage VDL remains at its maximum node voltage VDL_MX. As illustrated by waveforms 204*a-c*, the drain current ID may be substantially equal to its blocking state (e.g., leakage) current; and according to waveforms 205*a-c*, the drain voltage VDS remains at the maximum drain voltage VDS_MX.

Also, as illustrated by waveforms 203*a-c* at time t0, the cascode node voltage VDL may remain greater than the threshold voltage HS_TH. Therefore, at time to the comparator output voltage VCMP remains logic high (e.g., five volts) as illustrated by waveforms 206*a-c*.

According to the teachings herein, the time duration threshold may begin at time t0. Thus, as illustrated by waveform 207 and waveform 208*c*, the enable signal ENHS may continue to be exerted low (e.g., zero volts) so that signal HSOUT remains low (e.g., zero volts) at time to.

Behavior from Time t0 to Time t1

From time t0 to time t1 the controller 108 may continue to exert driver input voltage VDR high as depicted by waveform 201. In turn, the driver 110 continues to drive the FET gate G. Accordingly, gate voltage VGS may continue to increase (i.e., ramp); and the rate of increase (i.e., the time derivative of the gate voltage VGS) may depend, at least in part, upon a capacitance (e.g., gate capacitance) of the low voltage FET 103. Thus, as illustrated by waveforms 202*a-c*, the gate voltage VGS increases from its low value (e.g., zero volts) at time to (e.g., zero nanoseconds) toward value VG1 (e.g., two volts) at time t1 (e.g., ten nanoseconds).

During the period from time t0 to time t1, the GaN depletion mode FET 102 has not yet turned on; and the low voltage FET 103 has not turned on with enough strength to pull down the GaN source SH. Thus, from time t0 to time t1, the cascode switch 101 may remain off. For instance, as illustrated by waveforms 203*a-c*, the cascode node voltage VDL remains at its maximum node voltage VDL_MX. As illustrated by waveforms 204*a-c*, the drain current ID may continue to be substantially equal to its blocking state (e.g., leakage) current; and according to waveforms 205*a-c*, the drain voltage VDS remains at the maximum drain voltage VDS_MX.

Also, as illustrated by waveforms 203*a-c* from time t0 to time t1, the cascode node voltage VDL may remain greater than the threshold voltage HS_TH. Therefore, from time t0 to time t1 the comparator output voltage VCMP remains logic high (e.g., five volts) as illustrated by waveforms 206*a-c*. Additionally, as illustrated by waveform 207 and waveform 208*c*, the enable signal ENHS may continue to be exerted low (e.g., zero volts) so that signal HSOUT remains low (e.g., zero volts) from time t0 to time t1.

Behavior at Time t1

At time t1 (e.g., ten nanoseconds) the controller 108 may continue to exert driver input voltage VDR high as depicted by waveform 201; and in turn the driver 110 continues to drive the FET gate G. The gate voltage VGS may reach a value VG1 (e.g., two volts) whereby the low voltage FET 103 has sufficient drive to begin pulling down the GaN source SH. For instance, the value VG1 may be substantially equal to a threshold voltage of the low voltage FET 103. Additionally, the low voltage FET 103 may begin to have increased gain giving rise to an increase in effective gate capacitance (e.g., a Miller capacitance).

Accordingly, at time t1 the rate of change of the gate voltage VGS may decrease, in part, due to an increase in effective gate capacitance at the FET gate G. Thus, as illustrated by waveforms 202*a-c*, the rate of change (i.e., the time derivative) of gate voltage VGS decreases.

Also, at time t1, the GaN depletion mode FET 102 has not yet turned on; however, the low voltage FET 103 may have enough strength to pull down the GaN source SH. Thus, as illustrated by waveforms 203*a-c*, the cascode node voltage VDL may begin to decrease. from its maximum node voltage VDL_MX. As illustrated by waveforms 204a-c, the drain current ID may continue to be substantially equal to its blocking state (e.g., leakage) current; and according to waveforms 205a-c, the drain voltage VDS remains at the maximum drain voltage VDS_MX.

Also, as illustrated by waveforms 203a-c, the cascode node voltage VDL remains greater than the threshold voltage HS_TH. Therefore, at time t1 the comparator output voltage VCMP remains logic high (e.g., five volts) as illustrated by waveforms 206a-c. Additionally, as illustrated by waveform 207 and waveform 208c, the enable signal ENHS may continue to be exerted low (e.g., zero volts) so that signal HSOUT remains low (e.g., zero volts).

Behavior from Time t1 to Time t2

From time t1 to time t2, the controller 108 may continue to exert driver input voltage VDR high as depicted by waveform 201; and in turn the driver 110 continues to drive the FET gate G. During the period from time t1 to time t2, the GaN depletion mode FET 102 may continue to be off; and the low voltage FET 103 may continue to have sufficient drive to begin pulling down the GaN source SH. Accordingly, the rate of change (i.e., the time derivative) of gate voltage VGS may continue to be reduced due to an increased gain.

Thus, as illustrated by waveforms 202a-c, the rate of change (i.e., the time derivative) of gate voltage VGS has decreased such that the gate voltage VGS at time t2 may be substantially equal to the gate voltage VGS at time t1 (i.e., value VG1 at time t1).

Also, from time t1 to time t2, the GaN depletion mode FET 102 may be off while the low voltage FET 103 may continue to pull down the GaN source SH. Thus, as illustrated by waveforms 203a-c, the cascode node voltage VDL may monotonically decrease from its maximum node voltage VDL_MX at time t1 toward the threshold voltage magnitude GaN_VTH. As illustrated by waveforms 204a-c, the drain current ID may continue to be substantially equal to its blocking state (e.g., leakage) current; and according to waveforms 205a-c, the drain voltage VDS may remain at the maximum drain voltage VDS_MX.

As illustrated by waveforms 203a-c, the cascode node voltage VDL remains greater than the threshold voltage HS_TH. Therefore, from time t1 to time t2, the comparator output voltage VCMP remains logic high (e.g., five volts) as illustrated by waveforms 206a-c. Additionally, as illustrated by waveform 207 and waveform 208c, the enable signal ENHS may continue to be exerted low (e.g., zero volts) so that signal HSOUT remains low (e.g., zero volts).

Behavior at Time t2

At time t2 (e.g., twenty nanoseconds) the controller 108 may continue to exert driver input voltage VDR high as depicted by waveform 201. In turn the driver 110 continues to drive the FET gate G so that the GaN depletion mode FET 102 begins to turn on. As illustrated by waveforms 202a-c, the rate of change of the gate voltage VGS remains low.

As the GaN depletion mode FET 102 turns on, the cascode switch 101 turns on. Accordingly, as depicted by waveforms 203a-c, the rate of change of the cascode node voltage VDL may change.

As illustrated by waveforms 203a-c, the cascode node voltage VDL may still be greater than the threshold voltage HS_TH. Therefore, the comparator output voltage VCMP remains logic high (e.g., five volts) as illustrated by waveforms 206a-c. Additionally, as illustrated by waveform 207 and waveform 208c, the enable signal ENHS may continue to be exerted low (e.g., zero volts) so that signal HSOUT remains low (e.g., zero volts).

According to the teachings herein, the transient behavior of the cascode switch 101 may also become mode dependent at time t2 as the cascode switch 101 turns on.

DCM Behavior after Time t2

During DCM after time t2, the cascode node voltage VDL decreases below the threshold voltage HS_TH at time t3 (e.g., one hundred nanoseconds) within the threshold time duration THS (e.g., two-hundred fifty nanoseconds).

In DCM the cascode switch 101 may turn-on quickly and be configured to operate with zero current switching (ZCS).

After time t2 the controller 108 continues to exert driver input voltage VDR high as depicted by waveform 201.

As illustrated by waveform 202a, the rate of change of the gate voltage VGS remains low; and the gate voltage VGS is slightly greater than the value VG1 until time t4 (e.g., one-hundred fifty nanoseconds). At time t4 the gate voltage VGS may increase, due at least in part to a reduction in gain of the cascode switch. The decrease in gain may be accompanied by a decrease in capacitance (e.g., Miller capacitance) at the FET gate G. Accordingly, the gate voltage VGS rises until it reaches a maximum limit VG2 (e.g., twenty volts).

As illustrated by waveform 203a, the cascode node voltage VDL decreases to the threshold voltage HS_TH by time t3 (e.g., one hundred nanoseconds). As discussed below and according to semiconductor device physics, the cascode node voltage VDL may reach the threshold voltage HS_TH by time t3 due, at least in part, to the low voltage FET 103 coming out of saturation.

As illustrated by waveform 204a, the cascode switch current ID increases and decreases in accordance with a DCM configuration and DCM operating conditions. Relative to waveform 204b (CCM) and waveform 204c (fault mode), waveform 204a exhibits the least cascode switch current ID as a function of time.

For instance, under DCM operating conditions, the cascode switch current ID reaches a limit prior to time t3 and decreases towards a minimum (e.g., approximately zero amperes) at time t4. Concurrently, the low voltage FET 103 may begin to operate outside of saturation according to the following relationship (EQ. 1) for cascode switch current ID as a function of the transconductance GM_LVFET and threshold voltage VTH of the low voltage FET 103.

$$ID < (VGS - VTH) \times GM\_LVFET \qquad \text{EQ. 1}$$

In turn, the low voltage FET 103 may pull the cascode node voltage VDL with an increased rate determined, at least in part, by a ratio of the cascode switch current ID to the transconductance GM_LVFET (i.e., the ratio ID/GM_LVFET). For instance, as shown by waveform 203a, the cascode node voltage VDL decreases at a faster rate after time t2.

As illustrated by waveform 205a, the drain voltage VDS decreases and reaches its low value (e.g., a voltage less than one volt) between time t3 and time t4.

As illustrated by waveform 206a, the comparator output voltage VCMP transitions from high (e.g., five volts) to low (e.g., zero volts) at time t3 in response to the cascode node voltage VDL reaching and/or decreasing below the threshold voltage HS_TH.

As illustrated by waveform 207, the threshold time duration THS continues from time t0 to time t6 (e.g., two hundred fifty nanoseconds), at which time the controller 108 may transition (i.e., exert) the enable signal ENHS high (e.g., five volts).

Because the comparator output voltage VCMP is exerted low at time t3, prior to time t6, and within the threshold time duration THS, the logic AND gate 106 maintains signal HSOUT low (e.g., zero volts) for all time (e.g., all time including times t0-t7). In this manner, the protection circuit 104 recognizes DCM as a normal mode absent of fault (e.g., absent of a short circuit and/or overcurrent condition).

CCM Behavior after Time t2

During CCM after time t2, the cascode node voltage VDL decreases below the threshold voltage HS_TH at time t5 (e.g., two hundred nanoseconds) within the threshold time duration THS (e.g., two-hundred fifty nanoseconds).

After time t2 the controller 108 continues to exert driver input voltage VDR high as depicted by waveform 201.

As illustrated by waveform 202b, the rate of change of the gate voltage VGS remains low; and the gate voltage VGS is slightly greater than the value VG1 until time t6 (e.g., two-hundred fifty nanoseconds). At time t6 the gate voltage VGS may increase, due at least in part to a reduction in gain of the cascode switch. The decrease in gain may be accompanied by a decrease in capacitance (e.g., Miller capacitance) at the FET gate G. Accordingly, the gate voltage VGS rises until it reaches a maximum limit VG2 (e.g., twenty volts).

As illustrated by waveform 203b, the cascosde node voltage VDL decreases to the threshold voltage HS_TH by time t5 (e.g., two hundred nanoseconds). As discussed herein and according to semiconductor device physics, the cascode node voltage VDL may reach the threshold voltage HS_TH by time t5 due, at least in part, to the low voltage FET 103 coming out of saturation.

As illustrated by waveform 204b, the cascode switch current ID increases and decreases in accordance with a CCM configuration. The cascode switch current ID may ramp up (i.e., increase) until time t4. In one embodiment, at time t4 an external component such as a boost diode (e.g., diode DB) may start recovering so that the cascode switch current ID decreases. Relative to waveform 204a (DCM) and waveform 204c (fault mode), waveform 204b exhibits higher switch current ID than waveform 204a; however, waveform 204b, exhibits lower switch current ID than waveform 204c (fault mode) for time greater than time t4.

For instance, under CCM operating conditions, the cascode switch current ID reaches a limit at time t4 and may vary according to load conditions. Concurrently, the low voltage FET 103 may begin to operate outside of saturation according to the above relationship (EQ. 1) for cascode switch current ID. In turn, the low voltage FET 103 may pull the cascode node voltage VDL with an increased rate determined, at least in part, by a ratio of the cascode switch current ID to the transconductance GM_LVFET (i.e., the ratio ID/GM_LVFET). For instance, as shown by waveform 203b, the cascode node voltage VDL decreases at a faster rate after time t4.

As illustrated by waveform 205b, the drain voltage VDS decreases and reaches its low value (e.g., a voltage less than one volt) between time t5 and time t6.

As illustrated by waveform 206b, the comparator output voltage VCMP transitions from high (e.g., five volts) to low (e.g., zero volts) at time t5 in response to the cascode node voltage VDL reaching and/or decreasing below the threshold voltage HS_TH.

As illustrated by waveform 207, the threshold time duration THS continues from time t0 to time t6 (e.g., two hundred fifty nanoseconds), at which time the controller 108 may transition (i.e., exert) the enable signal ENHS high (e.g., five volts).

Because the comparator output voltage VCMP is exerted low at time t5, prior to time t6, and within the threshold time duration THS, the logic AND gate 106 maintains signal HSOUT low (e.g., zero volts) for all time (e.g., all time including times t0-t7). In this manner, the protection circuit 104 recognizes CCM as a normal mode absent of fault (e.g., absent of a short circuit and/or overcurrent condition).

Fault Mode Behavior after Time t2

During a fault mode (e.g., a short circuit and/or overcurrent condition) after time t2, the cascode node voltage VDL decreases below the threshold voltage HS_TH at time t7 (e.g., three hundred nanoseconds). As illustrated, time t7 occurs after the threshold time duration THS (e.g., two-hundred fifty nanoseconds).

After time t2 the controller 108 continues to exert driver input voltage VDR high as depicted by waveform 201.

As illustrated by waveform 202c, the rate of change of the gate voltage VGS remains low; and the gate voltage VGS is slightly greater than the value VG1. For instance, the low voltage FET 103 may continue to operate in saturation. Thus, for all illustrated time greater than time t2, the gate voltage VGS fails to reach a maximum limit VG2 (e.g., twenty volts).

As illustrated by waveform 203c, the cascosde node voltage VDL decreases gradually (i.e., exhibits a plateau) and reaches the threshold voltage HS_TH by time t7 (e.g., three hundred nanoseconds). In contrast to operation during DCM and CCM, operation during the fault may decrease gradually due, at least in part, to the low voltage FET 103 remaining in saturation. The gradual decrease in cascode node voltage VDL (i.e., the plateau) may also be due, at least in part, to gain. As described above with respect to waveform 202c, the low voltage FET 103 may be operating in its saturation region with high gain. Accordingly, the plateau may be indicative of gain and/or a high gain; and the gain may be referred to as a cascode circuit gain.

As illustrated by waveform 204c, the cascode switch current ID ramps (i.e., increases) in accordance with a fault condition (e.g., a short circuit). Relative to waveform 204a (DCM) and waveform 204b (CCM), waveform 204c exhibits higher switch current ID. For instance, as illustrated by waveform 204c, at time t7 the cascode switch current ID may ramp to and/or exceed twenty amperes due, at least in part, to the fault condition.

In contrast to CCM and DCM, during a fault condition, the cascode switch current ID increases such that the low voltage FET 103 continues to operate in saturation. Therefore, the cascode switch current ID may continue to vary according to the following relationship (EQ. 2).

$$ID = (VGS - VTH) \times GM\_LVFET \qquad \text{EQ. 2}$$

In turn, the cascode node voltage VDL may decrease gradually according to following relationship (EQ. 3) for cascode switch current ID as a function of the transconductance GM_GaN of the depletion mode FET 102.

$$VDL = GaN\_VTH - ID/GM\_GaN \qquad \text{EQ. 3}$$

Accordingly, the cascode node voltage VDL may decrease gradually (i.e., have a small slope) when the transconductance GM_GaN is large. Moreover, during the fault condition, the GaN depletion mode FET 102 may be exposed to high voltage.

For instance, as illustrated by waveform 205*c*, the drain voltage VDS remains substantially equal to its maximum drain voltage VDS_MX for illustrated times greater than time t2.

As illustrated by waveform 206*c*, the comparator output voltage VCMP transitions from high (e.g., five volts) to low (e.g., zero volts) at time t7 in response to the cascode node voltage VDL reaching and/or decreasing below the threshold voltage HS_TH.

As illustrated by waveform 207, the threshold time duration THS continues from time t0 to time t6 (e.g., two hundred fifty nanoseconds), at which time the controller 108 may transition (i.e., exert) the enable signal ENHS high (e.g., five volts).

Because the comparator output voltage VCMP remains high after time t6 and after the threshold time duration THS, the logic AND gate 106 transitions (i.e., exerts) signal HSOUT high (e.g., five voltage) at time t6. The signal HSOUT remains high until time t7 at which time the comparator output voltage VCMP is exerted low.

In this manner, the protection circuit 104 recognizes the presence of a fault (e.g., an overcurrent and/or short condition). During the period from time t6 to time t7 while the signal HSOUT is exerted high, the controller 108 may use the information to take corrective action. For instance, as illustrated in FIG. 3 below, the controller 108 may immediately turn off the cascode switch 101 in response to the signal HSOUT transitioning from low to high.

Figure 3:
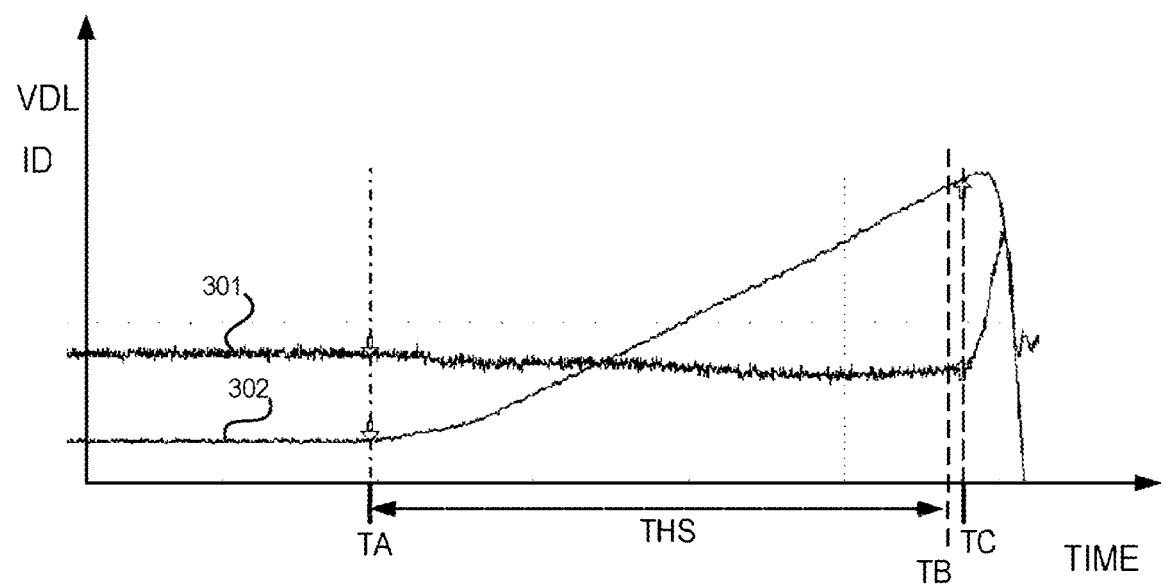
FIG. 3 illustrates empirical waveforms according to an embodiment.

FIG. 3 illustrates empirical waveforms 301-302 according to an embodiment. Waveform 301 depicts the cascode node voltage VDL from time TA to time TC, while waveform 302 depicts the cascode switch current ID from time TA to time TC. With reference to FIG. 2, time TA may correspond with the transition of waveform 201 at time to, time TB may correspond with time t6, and time TC may correspond with a time after time t6. Also, the threshold time duration may begin at time TA and may conclude at time TB; and with reference to FIG. 2, time TC may correspond with any time on the interval from time t6 to time t7 while signal HSOUT is exerted high. For instance, time TA may be zero nanoseconds (0 ns). Time TB may be two-hundred fifty nanoseconds (250 ns); and time TC may be two-hundred fifty-five nanoseconds (255 ns).

With reference to FIG. 1B, the overcurrent condition may be due, at least in part, to a short circuit. For instance, the inductor L1 may be shorted by a low impedance substantially equal to zero ohms (e.g., a one milliohm short). The calibrated value of the threshold voltage HS_TH may be approximately four volts (e.g., 4.15 volts); and the calibrated value of the threshold time duration THS may be less than three hundred nanoseconds (e.g., 250 nanoseconds).

Also, as illustrated by waveforms 301-302, the cascode node voltage VDL may gradually decrease (i.e., exhibit a plateau) during the overcurrent condition (e.g., inductor L1 shorted). For instance, the cascode node voltage VDL at time TA may be ten volts, and the cascode node voltage VDL at time TC may be seven volts. Accordingly, at time TB after the expiration of the threshold time duration THS, the protection circuit 104 may determine that the cascode node voltage VDL exceeds the threshold voltage HS_TH.

In turn, the protection circuit 104 may take corrective action to protect the cascode switch 101. For instance, the drive signal VDR may be exerted low immediately (e.g., within a nanosecond) by controller 108 at time TB. In turn, the driver 110 may drive the gate voltage VGS low when the cascade switch current ID reaches forty amperes at time TC.

Thus, in accordance with the teachings herein, the protection circuit 104 may advantageously and rapidly (e.g., within three hundred nanoseconds) turn off the cascode switch 101 before the cascode switch current ID exceeds its maximum current rating (e.g., a maximum current rating of fifty amperes).

According to the teachings herein, the protection circuit 104 may observe the cascode node voltage VDL from the cascode switch 101 for all time immediately following time t0. Thus, the protection may be implemented quickly and without leading edge blanking. Also according to the teachings herein, the fault condition may occur when the cascode node voltage exhibits a plateau and decreases gradually as a function of time. For instance, from time t2 through time t7 waveform 203*c* may decrease gradually; accordingly, waveform 203*c* may be characterized as exhibiting a plateau between time t2 and time t7.

Also, according to the teachings herein, protection circuit 104 may detect an overcurrent condition based upon the following temporal relationship (EQ. 4) of the cascode node voltage VDL for time greater than time to (i.e., the turn-on time to).

$$VDL \geq HS\_TH \text{ for } \{\text{time}: (t0 + THS) \leq \text{time}\} \qquad \text{EQ. 4}$$

Thus, according to the above relationship (EQ. 4), an overcurrent condition may exist if the cascode node voltage VDL is substantially greater than and/or equal to the threshold voltage HS_TH for at least a threshold time duration THS.

In one embodiment and according to semiconductor device operation, the plateau may be a consequence of gain (e.g., cascode switch gain). For instance, during the plateau from time t2, the low voltage FET 103 may be operating in its saturation region (i.e., high gain, high transconductance region).

Moreover, the protection circuit 104 may determine that the cascode switch 101 operates in a fault (i.e., an overcurrent) mode by virtue of the comparator 105 and by virtue of a threshold time duration THS (i.e., a time period THS). The threshold time duration THS (i.e., time period THS) may, for instance, be determined by the controller 108. Additionally, the comparator 105 may compare the cascode node voltage VDL to a threshold voltage HS_TH. If the comparator 105 remains in a logic high state (e.g., comparator output voltage VCMP is high) for more than a time THS, then the controller 108 may exert the enable signal ENHS to a logic high (see, e.g., waveform 207 at time t6).

In one embodiment the controller may adaptively adjust the threshold time duration THS in response to system parameters. For instance, the controller may adaptively adjust the threshold time duration THS as a function of the load.

In one aspect a power converter comprises a cascode circuit (e.g., cascode switch 101) and an overcurrent detection circuit (e.g., protection circuit 104). The cascode circuit includes a depletion mode field effect transistor 102 and an enhancement mode field effect transistor 103 electrically coupled in cascode to provide a cascode node voltage VDL. The overcurrent detection circuit is configured to detect an overcurrent fault condition during turn-on (see, e.g., waveform 207 for times t0-t6 in FIG. 2). The overcurrent condition occurs during a plateau of the cascode node voltage VDL (i.e., while waveform 203c decreases gradually). As discussed above, the plateau may be indicative of a gain of the cascode switch 101. For instance, the plateau may be indicative of the low voltage FET 103 operating in saturation.

In another aspect a method of detecting overcurrent in a gallium nitride (GaN) cascode circuit (e.g., cascode switch 101) comprises: turning on a GaN cascode circuit with a transient step (e.g., waveform 201 at time t0); receiving a cascode node voltage VDL; determining when the cascode node voltage VDL enters a plateau (e.g., waveform 203c); and indicating an overcurrent fault (e.g., waveforms 207, 208c). For instance, the protection circuit 104 and comparator 105 may determine that the cascode node voltage VDL is slowly decreasing by comparing the cascode node voltage VDL to reference voltage HS_TH. If this condition exists for more than time THS, then an overcurrent condition may exist. Accordingly, the overcurrent fault is indicated in response to the plateau existing for greater than a threshold time duration (i.e., time THS).

Protection circuit 104 may detect when cascode switch 101 is subjected to fault conditions (e.g., excessive switch current ID) without limitation to the way the fault occurs and without limitation to power converter configuration. In one configuration, protection circuit 104 may be used to rapidly detect overcurrent (i.e., an overcurrent of cascode switch current ID) For instance, in a PFC converter cascode switch 101 may be subjected to very high currents (e.g., fifty amperes) in a short period of time (e.g., one-hundred nanoseconds) if the PFC inductor is shorted. Alternatively, and additionally, a cascode switch 101 (e.g., a GaN cascode switch) used as the main switch in a boost converter may be subjected to very high currents when the boost diode is shorted.

In one application the controller 108 may protect the cascode switch 101 by immediately turning off the cascode switch 101 in response to determining a fault condition (i.e., an overcurrent condition). For instance, the controller 108 may exert the input drive signal VDR low when the signal HSOUT is exerted high. Alternatively, and additionally, the controller 108 may prevent the cascode switch 101 from turning on until after the controller 108 is recycled. Additionally, the controller 108 may be programmed to turn the cascode switch 101 off after the overcurrent condition is detected for more than a set number (e.g., five) of switching cycles.

The above description of illustrated examples of the present disclosure, including what is described in the Abstract are not intended to be exhaustive or to be limitation to the precise forms disclosed. While specific embodiments of, and examples for, fast turn-on protection of a cascode switch are described with reference to the following figures as described herein for illustrative purposes, various equivalent modifications are possible without departing from the broader spirit and scope of the present disclosure. Indeed, it is appreciated that the specific example voltages, currents, frequencies, power range values, times, etc., are provided for explanation purposes and that other values may also be employed in other embodiments and examples in accordance with the teachings herein.

Although the present invention is defined in the claims, it should be understood that the present invention can alternatively be defined in accordance with the following examples:

Example 1: A power converter comprises a cascode circuit and an overcurrent detection circuit. The cascode circuit includes a depletion mode field effect transistor and an enhancement mode field effect transistor electrically coupled in cascode. The cascode circuit is configured to provide a cascode node voltage. The overcurrent detection circuit is configured to detect an overcurrent fault condition during turn-on, wherein the overcurrent fault condition occurs during a plateau of the cascode node voltage, the plateau indicative of an increase in a cascode circuit gain.

Example 2: The power converter of example 1, wherein the overcurrent detection circuit comprises a comparator.

Example 3: The power converter of any one of the previous examples, wherein the overcurrent detection circuit comprises an AND gate.

Example 4: The power converter of any one of the previous examples, wherein the overcurrent detection circuit comprises a controller.

Example 5: The power converter of any one of the previous examples, wherein the depletion mode field effect transistor is a gallium nitride (GaN) depletion mode transistor.

Example 6: The power converter of any one of the previous examples, wherein the depletion mode field effect transistor is a silicon carbide (SiC) depletion mode transistor.

Example 7: The power converter of any one of the previous examples, wherein the enhancement mode field effect transistor is a low voltage field effect transistor.

Example 8: A method of detecting overcurrent in a gallium nitride (GaN) cascode circuit comprises: turning on the GaN cascode circuit with a transient step; receiving a cascode node voltage indicative of a cascode circuit gain; determining when the cascode node voltage enters a plateau indicative of an increase in the cascode circuit gain; and indicating an overcurrent fault in response to the plateau existing for greater than a threshold time duration.

Example 9: The method of any one of the previous examples, wherein turning on the GaN cascode circuit comprises providing a gate signal to a low voltage field effect transistor.

Example 10: The method of any one of the previous examples, wherein receiving the cascode node voltage indicative of the cascode circuit gain comprises receiving a drain voltage of the low voltage field effect transistor.

Example 11: The method of any one of the previous examples, wherein determining when the cascode node voltage enters the plateau indicative of the increase in the cascode circuit gain comprises comparing the drain voltage of the low voltage field effect transistor with a threshold voltage.

Example 12: The method of any one of the previous examples, wherein indicating the overcurrent fault in response to the plateau existing for greater than the threshold time duration comprises determining the threshold time duration using a controller.

Example 13: A method of rapidly detecting overcurrent in a power converter comprises: turning on a cascode switch with a transient step; receiving a cascode node voltage indicative of a cascode circuit gain; determining when the cascode node voltage enters a plateau indicative of an increase in the cascode circuit gain; and indicating an overcurrent fault in response to the plateau existing for greater than a threshold time duration.

Example 14: The method of any one of the previous examples, wherein the cascode switch comprises a depletion mode field effect transistor and an enhancement mode field effect transistor electrically coupled in cascode.

Example 15: The method of any one of the previous examples, wherein turning on the cascode switch comprises providing a gate signal to the enhancement mode field effect transistor.

Example 16: The method of any one of the previous examples, wherein receiving the cascode node voltage indicative of the cascode circuit gain comprises receiving a drain voltage of the enhancement mode field effect transistor.

Example 17: The method of any one of the previous examples, wherein determining when the cascode node voltage enters the plateau indicative of the increase in the cascode circuit gain comprises comparing the enhancement mode field effect transistor with a threshold voltage.

Example 18: The method of any one of the previous examples, wherein the threshold voltage is between one volt and ten volts.

Example 19: The method of any one of the previous examples, wherein indicating the overcurrent fault in response to the plateau existing for greater than the threshold time duration comprises determining the threshold time duration using a controller.

Example 20: The method of any one of the previous examples, wherein the threshold time duration is between one-hundred nanoseconds and three-hundred nanoseconds.

What is claimed is:

1. A power converter comprising:
   a cascode circuit including a depletion mode field effect transistor and an enhancement mode field effect transistor electrically coupled in cascode, the cascode circuit configured to provide a cascode node voltage; and
   an overcurrent detection circuit comprising:
      a comparator configured to compare the cascode node voltage with a threshold voltage; and
      a controller configured to define a period that corresponds to when the cascode node voltage gradually decreases, wherein the overcurrent detection circuit is configured to detect an overcurrent fault condition based, at least in part, on a duration of the period defined by the controller.

2. The power converter of claim 1, wherein the depletion mode field effect transistor is a gallium nitride (GaN) depletion mode transistor.

3. The power converter of claim 1, wherein the depletion mode field effect transistor is a silicon carbide (SiC) depletion mode transistor.

4. The power converter of claim 1, wherein the enhancement mode field effect transistor is a low voltage field effect transistor.

5. The power converter of claim 1, wherein the comparator is configured to transition a comparator output voltage in response to the cascode node voltage reaching the threshold voltage.

6. The power converter of claim 5, wherein the controller is configured to assert an enable signal after the duration.

7. The power converter of claim 6, wherein the overcurrent detection circuit is configured to detect the overcurrent fault condition based, at least in part, on the enable signal and the comparator output voltage.

8. The power converter of claim 7, wherein the overcurrent detection circuit comprises an AND gate configured to provide a signal indicative of a logical AND of the enable signal and the comparator output voltage.

9. The power converter of claim 8, wherein the overcurrent detection circuit is configured to detect the overcurrent fault condition in response to the signal transitioning from low to high.

10. The power converter of claim 6, wherein the time duration is a calibrated time duration.

* * * * *